US012740359B2

(12) United States Patent
Lin et al.

(10) Patent No.: US 12,740,359 B2
(45) Date of Patent: Sep. 15, 2026

(54) MANUFACTURING METHOD OF SEMICONDUCTOR STRUCTURE

(71) Applicant: Powerchip Semiconductor Manufacturing Corporation, Hsinchu (TW)

(72) Inventors: Hsiao-Chiang Lin, New Taipei City (TW); Yoshihiro Nomura, Hsinchu (TW); Chao Wen Huang, Hsinchu (TW)

(73) Assignee: Powerchip Semiconductor Manufacturing Corporation, Hsinchu (TW)

( * ) Notice: Subject to any disclaimer, the term of this patent is extended or adjusted under 35 U.S.C. 154(b) by 185 days.

(21) Appl. No.: 18/909,876

(22) Filed: Oct. 8, 2024

(65) Prior Publication Data

US 2026/0076120 A1 Mar. 12, 2026

(30) Foreign Application Priority Data

Sep. 12, 2024 (TW) ................................ 113134643

(51) Int. Cl.
*H10P 50/00* (2026.01)
*H10P 52/40* (2026.01)
(Continued)

(52) U.S. Cl.
CPC .......... *H10P 50/695* (2026.01); *H10P 52/402* (2026.01); *H10P 52/403* (2026.01);
(Continued)

(58) Field of Classification Search
None
See application file for complete search history.

(56) References Cited

U.S. PATENT DOCUMENTS 11,107,896 B2 * 8/2021 Huang .................. H10D 64/01
2002/0175414 A1 * 11/2002 Teh ...................... H10P 50/283 257/E23.152
2006/0121739 A1 * 6/2006 Farber .................. H10P 50/283 257/E21.252

FOREIGN PATENT DOCUMENTS

| TW | 202218089 | 5/2022 |
|---|---|---|
| TW | 202345318 | 11/2023 |
| TW | 202345332 | 11/2023 |

OTHER PUBLICATIONS

"Office Action of Taiwan Counterpart Application", issued on Feb. 19, 2025, p. 1-p. 4.

* cited by examiner

*Primary Examiner* — Shamim Ahmed
(74) *Attorney, Agent, or Firm* — JCIPRNET

(57) ABSTRACT

A manufacturing method of a semiconductor structure including following steps is provided. A patterned photoresist layer is formed on a substrate by a lithography process. The patterned photoresist layer includes a first opening and a second opening. The first opening includes a first inclined sidewall. An etching process is performed on the substrate by using the patterned photoresist layer as a mask to form a third opening corresponding to the first opening and a fourth opening corresponding to the second opening in the substrate. The third opening includes a second inclined sidewall. A conductive layer is formed on the substrate. The conductive layer fills the third opening and the fourth opening. A portion of the conductive layer is removed by using the conductive layer located in the third opening as a stop layer to form a mark in the third opening and a TSV in the fourth opening.

20 Claims, 5 Drawing Sheets

(51) Int. Cl.
*H10P 76/20* (2026.01)
*H10W 20/00* (2026.01)
*H10W 46/00* (2026.01)

(52) U.S. Cl.
CPC ....... *H10P 76/2041* (2026.01); *H10W 20/056* (2026.01); *H10W 20/082* (2026.01); *H10W 46/00* (2026.01)

MANUFACTURING METHOD OF SEMICONDUCTOR STRUCTURE

CROSS-REFERENCE TO RELATED APPLICATION

This application claims the priority benefit of Taiwan application serial no. 113134643, filed on Sep. 12, 2024. The entirety of the above-mentioned patent application is hereby incorporated by reference herein and made a part of this specification.

BACKGROUND

Technical Field

The invention relates to a manufacturing method of a semiconductor structure, and particularly relates to a manufacturing method of a semiconductor structure including a mark.

Description of Related Art

Currently, the mark (e.g., alignment mark or overlay mark) are used to monitor the formation status of the through-substrate via (TSV). The method of forming the mark may include forming an opening in a substrate, and then filling the opening with a conductive layer to form a conductive mark. However, if the conductive layer is not filled in the opening, the conductive mark cannot be formed in the opening. As a result, in the subsequent bonding process, a void formed by the opening located on the bonding surface will cause the bonding process to fail.

SUMMARY

The invention provides a manufacturing method of a semiconductor structure, which can smoothly form the mark in the opening, thereby preventing the subsequent bonding process failure.

The invention proposes a manufacturing method of a semiconductor structure, which includes the following steps. A substrate is provided. A patterned photoresist layer is formed on the substrate by a lithography process. The patterned photoresist layer includes a first opening and a second opening. The first opening includes a first inclined sidewall. An etching process is performed on the substrate by using the patterned photoresist layer as a mask to form a third opening corresponding to the first opening and a fourth opening corresponding to the second opening in the substrate. The third opening includes a second inclined sidewall. A conductive layer is formed on the substrate. The conductive layer fills the third opening and the fourth opening. A portion of the conductive layer is removed by using the conductive layer located in the third opening as a stop layer to form a mark in the third opening and a through-substrate via (TSV) in the fourth opening.

According to an embodiment of the invention, in the manufacturing method of the semiconductor structure, the conductive layer does not completely fill the third opening.

According to an embodiment of the invention, in the manufacturing method of the semiconductor structure, in the process of removing the portion of the conductive layer, a portion of the substrate may be removed at the same time to remove a portion of the third opening that is not completely filled.

According to an embodiment of the invention, in the manufacturing method of the semiconductor structure, the method of removing the portion of the conductive layer and the portion of the substrate is, for example, a chemical mechanical polishing method.

According to an embodiment of the invention, in the manufacturing method of the semiconductor structure, the width of the first opening may be smaller than the width of the second opening. The width of the third opening may be smaller than the width of the fourth opening.

According to an embodiment of the invention, in the manufacturing method of the semiconductor structure, the width of the top portion of the first opening may be greater than the width of the bottom portion of the first opening.

According to an embodiment of the invention, in the manufacturing method of the semiconductor structure, the cross-sectional shape of the first opening may be a funnel shape.

According to an embodiment of the invention, in the manufacturing method of the semiconductor structure, the width of the top portion of the third opening may be greater than the width of the bottom portion of the third opening.

According to an embodiment of the invention, in the manufacturing method of the semiconductor structure, the cross-sectional shape of the third opening may be a funnel shape.

According to an embodiment of the invention, in the manufacturing method of the semiconductor structure, the patterned photoresist layer may be consumed and removed in the etching process.

According to an embodiment of the invention, in the manufacturing method of the semiconductor structure, the lithography process may include the following steps. A photoresist layer is formed on the substrate. An exposure process is performed on the photoresist layer by using a photomask as a mask. A development process is performed on the photoresist layer to form the patterned photoresist layer after the exposure process is performed.

According to an embodiment of the invention, in the manufacturing method of the semiconductor structure, the method of forming the photoresist layer is, for example, a spin coating method.

According to an embodiment of the invention, in the manufacturing method of the semiconductor structure, the photomask may include a transparent substrate and a light-shielding layer. The light-shielding layer is located on the transparent substrate. The light-shielding layer may include a fifth opening and a sixth opening. The first opening may correspond to the fifth opening. The second opening may correspond to the sixth opening.

According to an embodiment of the invention, in the manufacturing method of the semiconductor structure, the photomask may include gray-tone regions. The gray-tone regions are located in the fifth opening and are adjacent to the sidewalls of the fifth opening.

According to an embodiment of the invention, in the manufacturing method of the semiconductor structure, the light transmittance of the gray-tone regions may be greater than 0% and less than 100%.

According to an embodiment of the invention, in the manufacturing method of the semiconductor structure, the light transmittance of the gray-tone region may be increased in a direction away from the sidewall of the fifth opening.

According to an embodiment of the invention, in the manufacturing method of the semiconductor structure, the light-shielding layer may include island-shape patterns. The island-shape patterns are located in the gray-tone regions and are separated from each other.

According to an embodiment of the invention, in the manufacturing method of the semiconductor structure, there is no gray-tone region in the sixth opening.

According to an embodiment of the invention, in the manufacturing method of the semiconductor structure, the material of the transparent substrate is, for example, quartz.

According to an embodiment of the invention, in the manufacturing method of the semiconductor structure, the material of the light-shielding layer is, for example, an opaque material.

Based on the above description, in the manufacturing method of the semiconductor structure according to the invention, since the third opening includes the second inclined sidewall, the conductive layer can be smoothly filled in the third opening. In this way, after a portion of the conductive layer is removed by using the conductive layer located in the third opening as a stop layer, the mark can be smoothly formed in the third opening, thereby preventing the subsequent bonding process failure.

In order to make the aforementioned and other objects, features and advantages of the invention comprehensible, several exemplary embodiments accompanied with drawings are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

The embodiments are described in detail below with reference to the accompanying drawings, but the embodiments are not intended to limit the scope of the invention. For the sake of easy understanding, the same components in the following description will be denoted by the same reference symbols. In addition, the drawings are for illustrative purposes only and are not drawn to the original dimensions. In fact, the dimensions of the various features may be arbitrarily increased or reduced for clarity of discussion.

FIG. 1A to FIG. 1E are cross-sectional views of a manufacturing process of a semiconductor structure according to some embodiments of the invention.

Figure 1A:
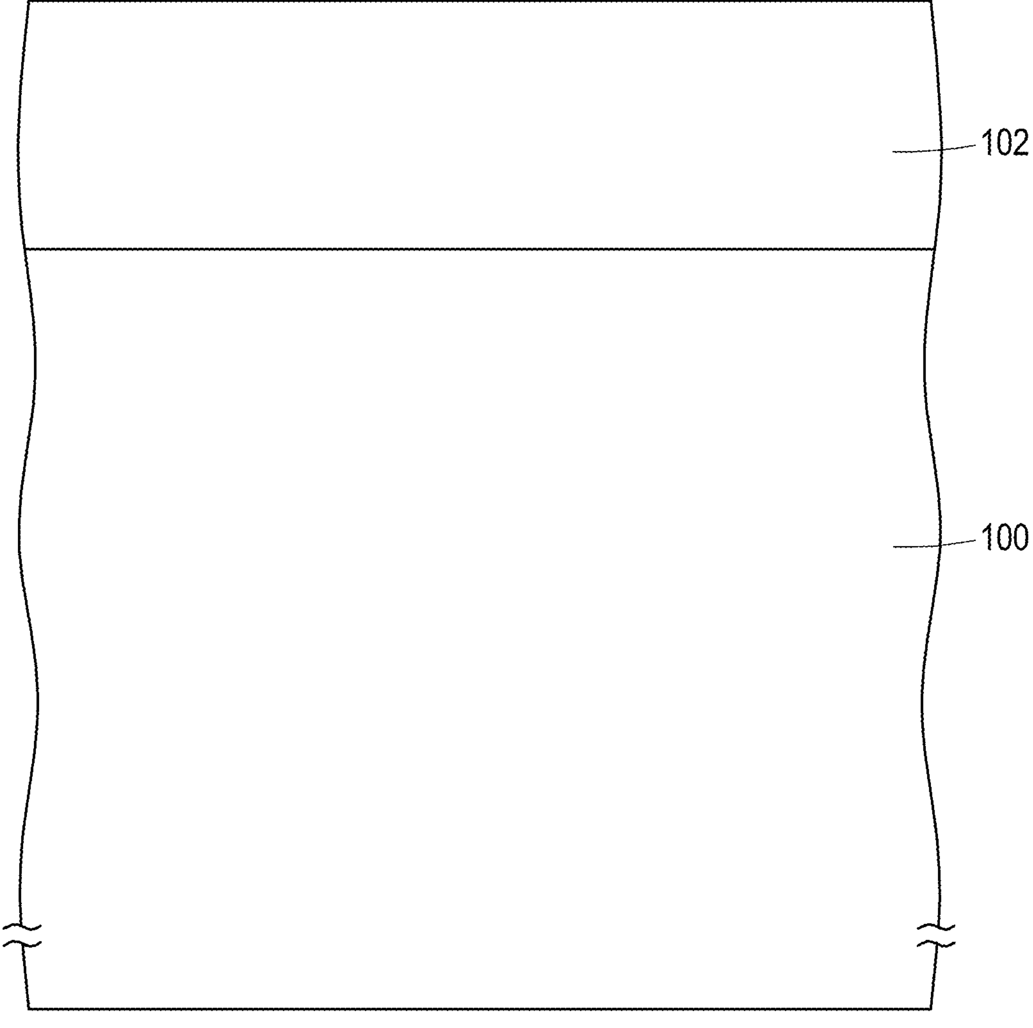
FIG. 1A to FIG. 1E are cross-sectional views of a manufacturing process of a semiconductor structure according to some embodiments of the invention.
Figure 1B:
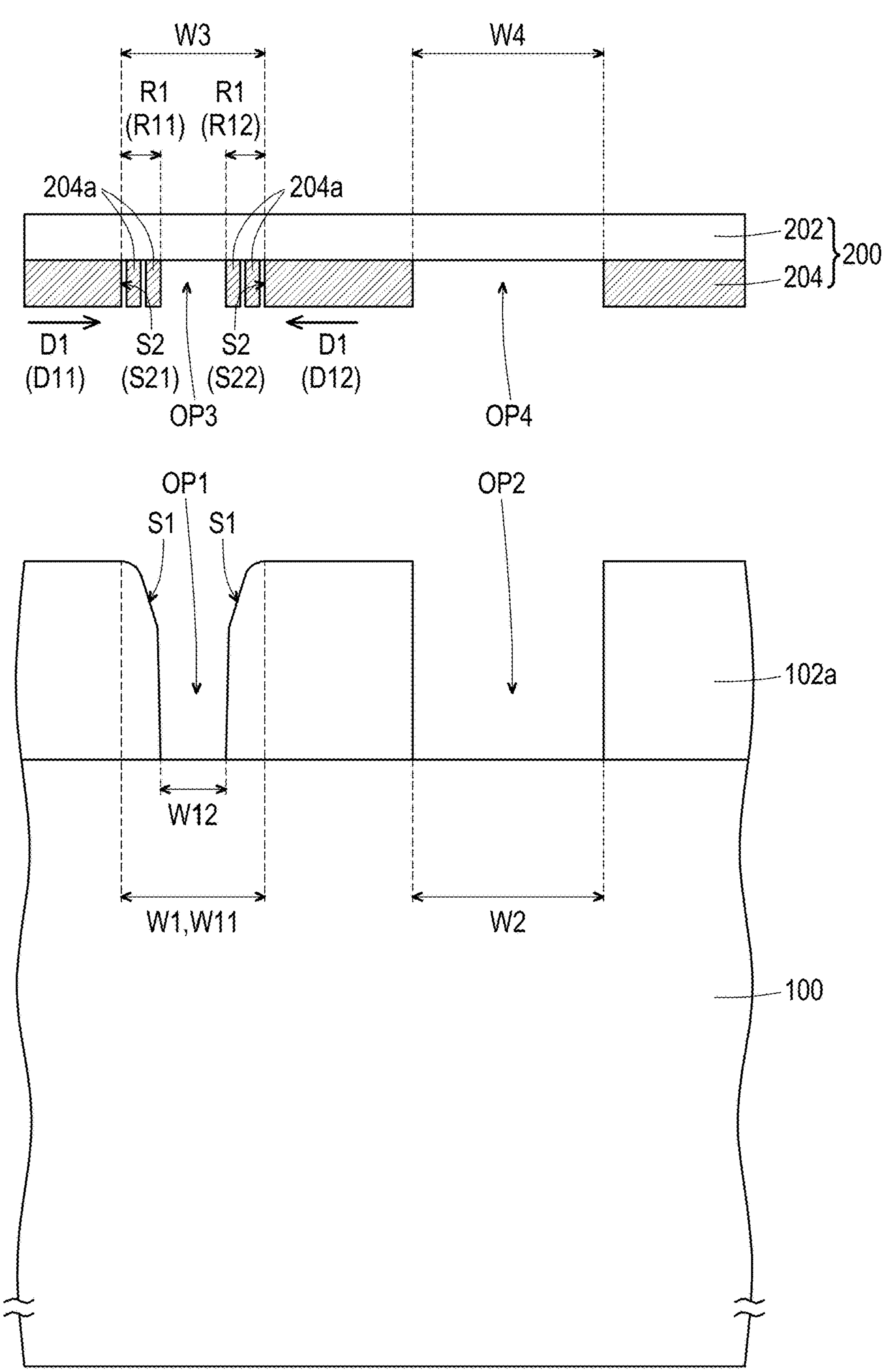

Referring to FIG. 1A, a substrate 100 is provided. In some embodiments, the substrate 100 may be a semiconductor substrate such as a silicon substrate. As shown in FIG. 1A and FIG. 1B, a patterned photoresist layer 102*a* is formed on the substrate 100 by a lithography process. The patterned photoresist layer 102*a* includes an opening OP1 and an opening OP2. The opening OP1 includes an inclined sidewall S1. In some embodiments, the width W1 of the opening OP1 may be smaller than the width W2 of the opening OP2. In some embodiments, the width W11 of the top portion of the opening OP1 may be greater than the width W12 of the bottom portion of the opening OP1. In some embodiments, the cross-sectional shape of the opening OP1 may be a funnel shape.

In some embodiments, the lithography process may include the following steps. First, as shown in FIG. 1A, a photoresist layer 102 may be formed on the substrate 100. In some embodiments, the method of forming the photoresist layer 102 is, for example, a spin coating method.

Next, as shown in FIG. 1B, an exposure process may be performed on the photoresist layer 102 by using a photomask 200 as a mask. In some embodiments, the photomask 200 may include a transparent substrate 202 and a light-shielding layer 204. In some embodiments, the material of the transparent substrate 202 is, for example, quartz. The light-shielding layer 204 is located on the transparent substrate 202. The light-shielding layer 204 may include an opening OP3 and an opening OP4. The opening OP1 may correspond to the opening OP3. The opening OP2 may correspond to the opening OP4. In some embodiments, the width W3 of the opening OP3 may be smaller than the width W4 of the opening OP4. In some embodiments, the photomask 200 may include gray-tone regions R1. The gray-tone regions R1 are located in the opening OP3 and are adjacent to the sidewalls S2 of the opening OP3. There is no gray-tone region in the opening OP4. In some embodiments, the material of the light-shielding layer 204 is, for example, an opaque material. In some embodiments, the material of the light-shielding layer 204 is, for example, chromium.

The light-shielding layer 204 may include island-shape patterns 204*a*. The island-shape patterns 204*a* are located in the gray-tone regions R1 and are separated from each other, so the light transmittance of the gray-tone regions R1 may be greater than 0% and less than 100%. In some embodiments, the light transmittance of the gray-tone region R1 may be adjusted by the number, the density, and the spacing of the island-shape patterns 204*a*. In some embodiments, the light transmittance of the gray-tone region R1 may be increased in a direction D1 away from the sidewall S2 of the opening OP3. For example, the light transmittance of the gray-tone region R11 may be increased in a direction D11 away from the sidewall S21 of the opening OP3, and the light transmittance of the gray-tone region R12 may be increased in a direction D12 away from the sidewall S22 of the opening OP3. In addition, the number of the island-shape patterns 204*a* is not limited to the number in the FIGURE. As long as the number of the island-shape patterns 204*a* is plural, it falls within the scope of the invention.

Then, a development process is performed on the photoresist layer 102 to form the patterned photoresist layer 102*a* after the exposure process is performed. Since the gray-tone region R1 of the photomask 200 only partially transmits light, and the pattern in the gray-tone region R1 of the photomask 200 will not be imaged on the photoresist layer 102, a portion of the photoresist layer 102 corresponding to the gray-tone region R1 can be partially removed in the development process, so that the opening OP1 has the inclined sidewall S1.

Figure 1C:
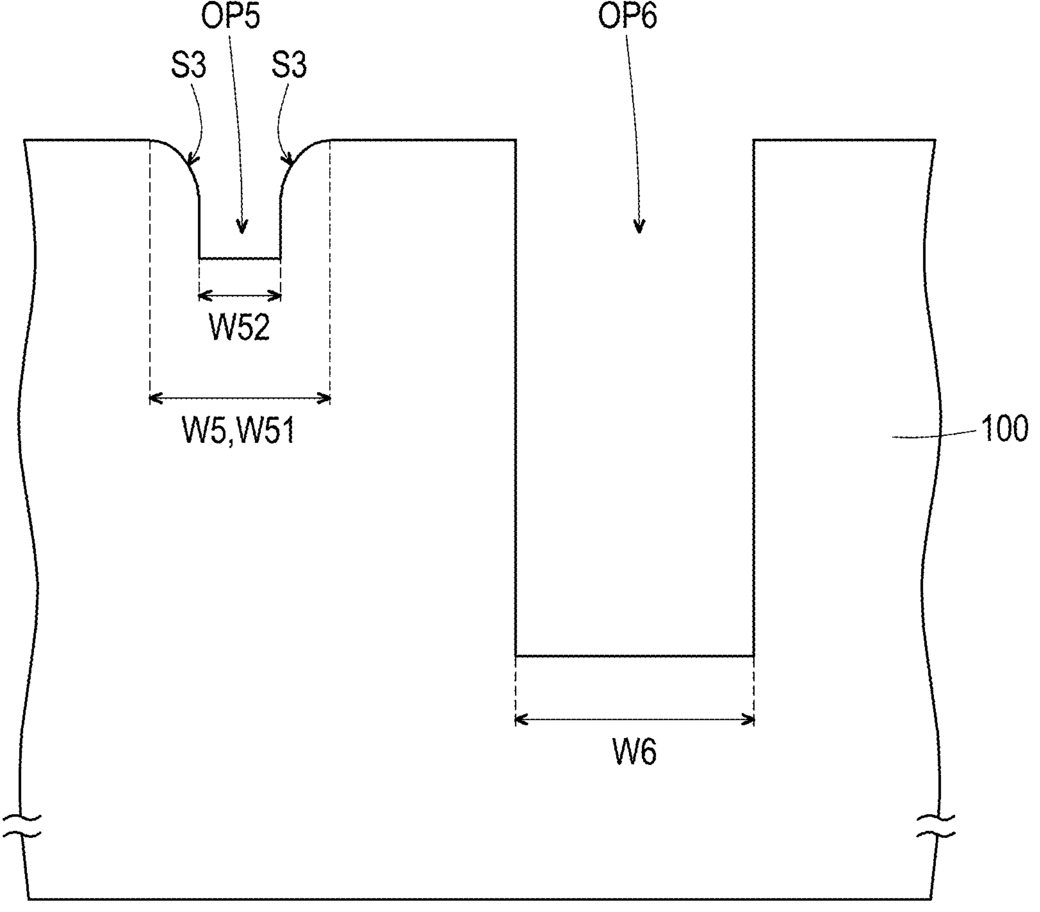

Referring to FIG. 1C, an etching process is performed on the substrate 100 by using the patterned photoresist layer 102*a* as a mask to form an opening OP5 corresponding to the opening OP1 and an opening OP6 corresponding to the opening OP2 in the substrate 100. Since the opening OP1 of the patterned photoresist layer 102*a* includes the inclined sidewall S1, and the opening OP5 is formed by performing an etching process on the substrate 100 by using the patterned photoresist layer 102*a* as a mask, the opening OP5 may include the inclined sidewall S3. In some embodiments, the width W5 of the opening OP5 may be smaller than the width W6 of the opening OP6. In some embodiments, the width W51 of the top portion of the opening OP5 may be greater than the width W52 of the bottom portion of the opening OP5. In some embodiments, the cross-sectional shape of the opening OP5 may be a funnel shape. In some embodiments, the patterned photoresist layer 102*a* may be consumed and removed in the etching process.

Figure 1D:
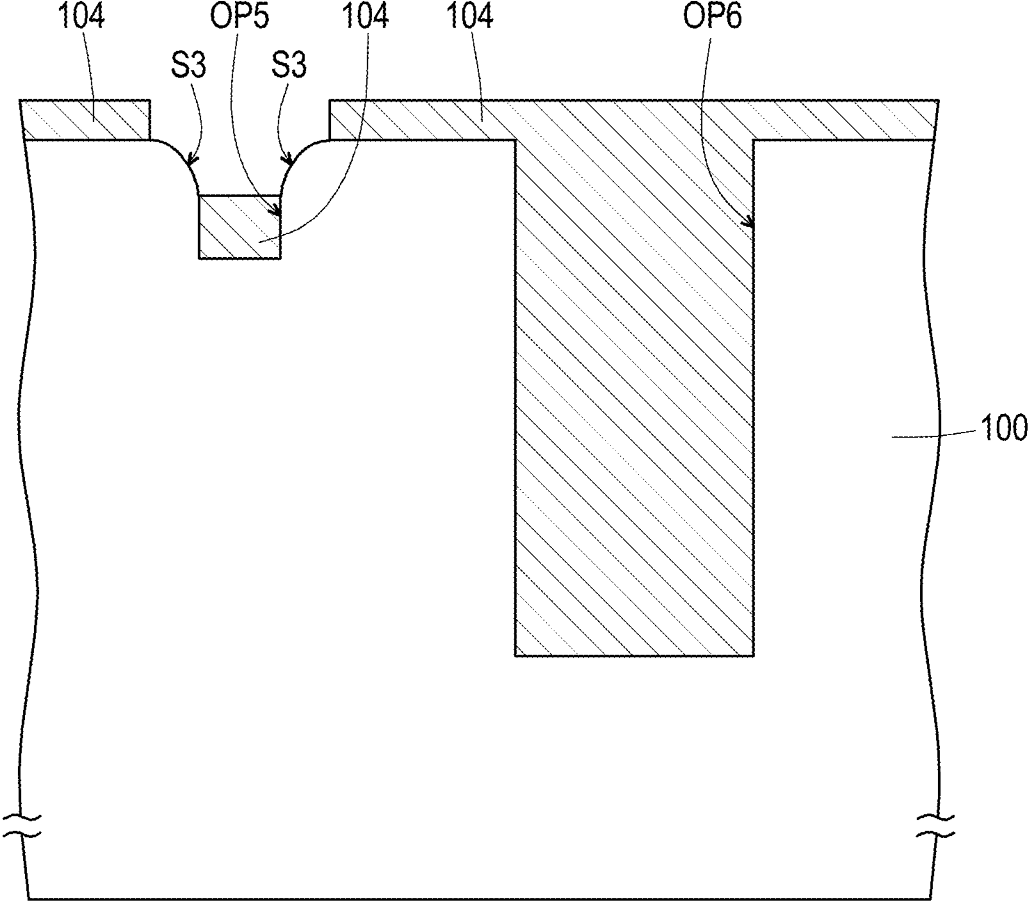

Referring to FIG. 1D, a conductive layer 104 is formed on the substrate 100. The conductive layer 104 fill the opening OP5 and the opening OP6. Since the opening OP5 includes the inclined sidewall S3, the conductive layer 104 can be smoothly filled in the opening OP5. In some embodiments, the conductive layer 104 does not completely fill the opening OP5. In some embodiments, the material of the conductive layer 104 is, for example, copper. In some embodiments, the method of forming the conductive layer 104 is, for example, an electrochemical plating (ECP) method.

Figure 1E:
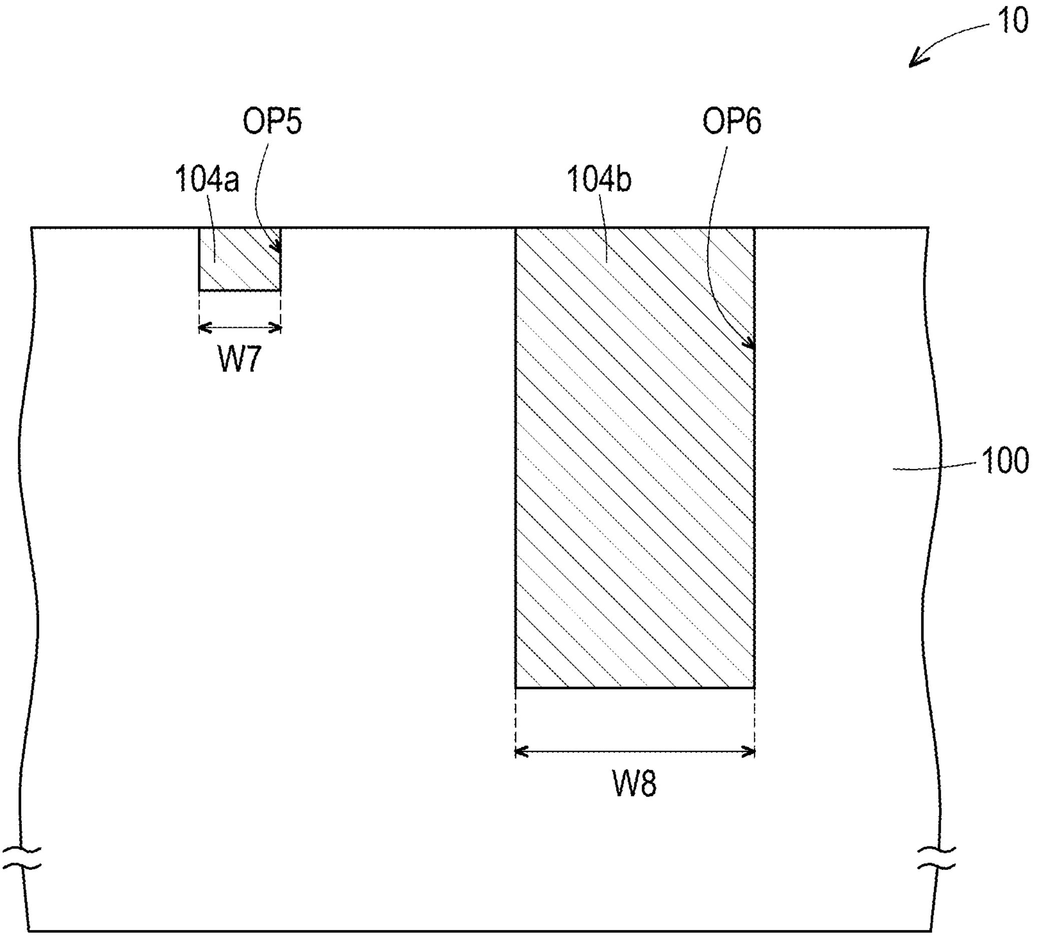

Referring to FIG. 1E, a portion of the conductive layer 104 is removed by using the conductive layer 104 located in the opening OP5 as a stop layer to form a mark 104*a* in the opening OP5 and a through-substrate via (TSV) 104*b* in the opening OP6. By the above method, the mark 104*a* can be smoothly formed in the opening OP5, thereby preventing the subsequent bonding process failure. In some embodiments, in the process of removing the portion of the conductive layer 104, a portion of the substrate 100 may be removed at the same time to remove a portion of the opening OP5 that is not completely filled, thereby further preventing the subsequent bonding process failure. In some embodiments, in the process of removing the portion of the substrate 100, the inclined sidewall S3 of the opening OP5 may be removed. In some embodiments, the width W7 of the mark 104*a* may be smaller than the width W8 of the TSV 104*b*. In some embodiments, the method of removing the portion of the conductive layer 104 and the portion of the substrate 100 is, for example, a chemical mechanical polishing method.

In some embodiments, a dielectric layer (not shown) may be formed between the TSV 104*b* and the substrate 100, a dielectric layer (not shown) may be formed between the mark 104*a* and the substrate 100, and the description thereof is omitted here.

Based on the above embodiments, in the manufacturing method of the semiconductor structure 10, since the opening OP5 includes the inclined sidewall S3, the conductive layer 104 can be smoothly filled in the opening OP5. In this way, after a portion of the conductive layer 104 is removed by using the conductive layer 104 located in the opening OP5 as a stop layer, the mark 104*a* can be smoothly formed in the opening OP5, thereby preventing the subsequent bonding process failure.

In summary, the manufacturing method of the semiconductor structure of the aforementioned embodiment includes the following steps. A substrate is provided. A patterned photoresist layer is formed on the substrate by a lithography process. The patterned photoresist layer includes a first opening and a second opening. The first opening includes a first inclined sidewall. An etching process is performed on the substrate by using the patterned photoresist layer as a mask to form a third opening corresponding to the first opening and a fourth opening corresponding to the second opening in the substrate. The third opening includes a second inclined sidewall. A conductive layer is formed on the substrate. The conductive layer fills the third opening and the fourth opening. A portion of the conductive layer is removed by using the conductive layer located in the third opening as a stop layer to form a mark in the third opening and a through-substrate via (TSV) in the fourth opening. Since the third opening includes the second inclined sidewall, the conductive layer can be smoothly filled in the third opening. In this way, after a portion of the conductive layer is removed by using the conductive layer located in the third opening as a stop layer, the mark can be smoothly formed in the third opening, thereby preventing the subsequent bonding process failure.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A manufacturing method of a semiconductor structure, comprising:
   - providing a substrate;
   - forming a patterned photoresist layer on the substrate by a lithography process, wherein the patterned photoresist layer comprises a first opening and a second opening, and the first opening comprises a first inclined sidewall;
   - performing an etching process on the substrate by using the patterned photoresist layer as a mask to form a third opening corresponding to the first opening and a fourth opening corresponding to the second opening in the substrate, wherein the third opening comprises a second inclined sidewall;
   - forming a conductive layer on the substrate, wherein the conductive layer fills the third opening and the fourth opening; and
   - removing a portion of the conductive layer by using the conductive layer located in the third opening as a stop layer to form a mark in the third opening and a through-substrate via in the fourth opening.

2. The manufacturing method of the semiconductor structure according to claim 1, wherein the conductive layer does not completely fill the third opening.

3. The manufacturing method of the semiconductor structure according to claim 2, wherein in the process of removing the portion of the conductive layer, a portion of the substrate is removed at the same time to remove a portion of the third opening that is not completely filled.

4. The manufacturing method of the semiconductor structure according to claim 3, wherein a method of removing the portion of the conductive layer and the portion of the substrate comprises a chemical mechanical polishing method.

5. The manufacturing method of the semiconductor structure according to claim 1, wherein a width of the first opening is smaller than a width of the second opening, and a width of the third opening is smaller than a width of the fourth opening.

6. The manufacturing method of the semiconductor structure according to claim 1, wherein a width of a top portion of the first opening is greater than a width of a bottom portion of the first opening.

7. The manufacturing method of the semiconductor structure according to claim 1, wherein a cross-sectional shape of the first opening comprises a funnel shape.

8. The manufacturing method of the semiconductor structure according to claim 1, wherein a width of a top portion of the third opening is greater than a width of a bottom portion of the third opening.

9. The manufacturing method of the semiconductor structure according to claim 1, wherein a cross-sectional shape of the third opening comprises a funnel shape.

10. The manufacturing method of the semiconductor structure according to claim 1, wherein the patterned photoresist layer is consumed and removed in the etching process.

11. The manufacturing method of the semiconductor structure according to claim 1, wherein the lithography process comprises:

forming a photoresist layer on the substrate;

performing an exposure process on the photoresist layer by using a photomask as a mask; and performing a development process on the photoresist layer to form the patterned photoresist layer after performing the exposure process.

12. The manufacturing method of the semiconductor structure according to claim 11, wherein a method of forming the photoresist layer comprises a spin coating method.

13. The manufacturing method of the semiconductor structure according to claim 11, wherein the photomask comprises:

a transparent substrate; and a light-shielding layer located on the transparent substrate, wherein the light-shielding layer comprises a fifth opening and a sixth opening, the first opening corresponds to the fifth opening, and the second opening corresponds to the sixth opening.

14. The manufacturing method of the semiconductor structure according to claim 13, wherein the photomask comprises gray-tone regions, and the gray-tone regions are located in the fifth opening and are adjacent to sidewalls of the fifth opening.

15. The manufacturing method of the semiconductor structure according to claim 14, wherein a light transmittance of the gray-tone regions is greater than 0% and less than 100%.

16. The manufacturing method of the semiconductor structure according to claim 14, wherein the light transmittance of the gray-tone region is increased in a direction away from the sidewall of the fifth opening.

17. The manufacturing method of the semiconductor structure according to claim 14, wherein the light-shielding layer comprises island-shape patterns, and the island-shape patterns are located in the gray-tone regions and are separated from each other.

18. The manufacturing method of the semiconductor structure according to claim 13, wherein there is no gray-tone region in the sixth opening.

19. The manufacturing method of the semiconductor structure according to claim 13, wherein a material of the transparent substrate comprises quartz.

20. The manufacturing method of the semiconductor structure according to claim 13, wherein a material of the light-shielding layer comprises an opaque material.

* * * * *